(12) United States Patent
Liu et al.

(10) Patent No.: US 7,473,626 B2
(45) Date of Patent: Jan. 6, 2009

(54) CONTROL OF POLY-SI DEPLETION IN CMOS VIA GAS PHASE DOPING

(75) Inventors: Yaocheng Liu, Elmsford, NY (US); Alexander Reznicek, Mount Kisco, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 11/402,177

(22) Filed: Apr. 11, 2006

(65) Prior Publication Data

US 2007/0238276 A1    Oct. 11, 2007

(51) Int. Cl.
*H01L 21/3205* (2006.01)
*H01L 21/4763* (2006.01)

(52) U.S. Cl. .................. 438/592; 438/585; 438/593; 257/412; 257/413

(58) Field of Classification Search .................. 438/585, 438/592–595, 602, 604; 257/412–413
See application file for complete search history.

(56) References Cited

U.S. PATENT DOCUMENTS

| 5,489,550 | A | 2/1996 | Moslehi |
| 5,599,735 | A | 2/1997 | Moslehi |
| 5,641,707 | A | 6/1997 | Moslehi |
| 6,271,595 | B1 * | 8/2001 | McGahay et al. ............ 257/762 |
| 6,686,637 | B1 * | 2/2004 | Dokumaci et al. .......... 257/412 |
| 2002/0022354 | A1 | 2/2002 | Furukawa et al. |

* cited by examiner

*Primary Examiner*—Phuc T Dang
(74) *Attorney, Agent, or Firm*—Scully, Scott, Murphy & Presser, P.C.; Robert M Trepp, Esq.

(57) ABSTRACT

A method to control the poly-Si depletion effect in CMOS structures utilizing a gas phase doping process which is capable of providing a high concentration of dopant atoms at the gate dielectric/poly-Si interface is provided. The present invention also provides CMOS structure including, for example, nFETs and/or pFETs, that are fabricated utilizing the gas phase doping technique described herein.

1 Claim, 4 Drawing Sheets

CONTROL OF POLY-SI DEPLETION IN CMOS VIA GAS PHASE DOPING

FIELD OF THE INVENTION

The present invention relates to a semiconductor structure and a method of fabricating the same. More particularly, the present invention relates to a complementary metal oxide semiconductor (CMOS) structure including poly-Si gates wherein a high concentration of uniformly distributed dopants is present at the interface between the underlying gate dielectric and the poly-Si gate electrode. The present invention also relates to a method of forming such a CMOS structure in which gas phase doping is employed to provide said dopants at the gate dielectric/poly-Si interface.

BACKGROUND OF THE INVENTION

Performance gains in high performance logic circuits rely on increasing the 'on' current without increasing the 'off' current. As device dimensions are scaled, performance gains are more difficult to achieve. One particular aspect of scaling involves reducing the physical thickness of the gate oxide. For a given gate voltage, an electric field is established across the gate oxide. If the gate oxide is reduced, then the magnitude of the electric field increases for the same gate voltage. In the case of a pFET device, a negative voltage is applied to the gate to turn 'on' the device. When the device is in the 'on' state, the channel becomes inverted with respect to its majority carrier type. As inversion charges in the channel increase, the gate becomes depleted of its majority carrier.

Depletion of charge carriers at, or near, the interface between the gate oxide/polySi gate (known as the poly depletion effect) has been a problem for complementary metal oxide semiconductor (CMOS) devices, and in particular for pFET devices. The depletion causes a virtual increase in gate dielectric thickness thereby adversely impacting device performance. The effect of the depletion becomes increasingly important with progressively decreasing gate oxide thickness because the poly depletion effect increase becomes fractionally higher.

In the traditional CMOS process, poly-Si gates are doped during the self-aligned source/drain implantation and they are activated during a subsequent activation anneal step. The implantation energy used in the prior art process is selected so that the dopant atoms will not penetrate to deeply within the poly-Si gate electrode. As such, there is a relatively small concentration (on the order of about $10^{18}$ atoms/cm$^3$ or less) of dopant atoms that can reach the gate dielectric/poly-Si gate interface by implantation. Although diffusion can bring more dopant atoms to the gate dielectric/poly-Si interface, the doping concentration at the interface is always the lowest. Moreover, the dopant atoms present at the gate dielectric/poly-Si gate interface are unevenly distributed.

In order to circumvent the poly depletion effect mentioned above, it is desired to have a high concentration (on the order of about $10^{19}$ atoms/cm$^3$ or greater) of activated dopants at the gate dielectric/poly-Si gate interface. The nature of the prior art implantation profile makes it hard to precisely place a large concentration of dopants close to this interface.

In view of the above, a method is needed that is capable of providing a CMOS structure having a high concentration of dopant atoms at the interface between the gate dielectric and the overlying poly-Si gate.

SUMMARY OF THE INVENTION

The present invention provides a method to control the poly-Si depletion effect in CMOS structures utilizing a gas phase doping process which is capable of providing a high concentration of dopant atoms at the gate dielectric/poly-Si interface. The term "high concentration" when used in describing the dopant atoms at the gate dielectric/poly-Si gate interface denotes a content of n– or p-type atoms that is about $10^{19}$ atoms/cm$^3$ or greater. More typically, the gas phase doping process provides a concentration of n-type dopants or p-type dopants at the gate dielectric/poly-Si gate interface that is about $10^{20}$ atoms/cm$^3$ or greater.

In addition to providing a high concentration of dopant atoms at the gate dielectric/poly-Si gate interface, the inventive method as provides a means for obtaining uniformly distributed doping at the interface between the gate dielectric and the overlying poly-Si gate. The term "uniformly distributed" is used throughout the present application to denote that the content of dopant atoms that is within 5 nm from the gate dielectric/poly-Si gate interface is substantially the same, e.g., having a dopant content variation of less than a factor of 2.

The present invention can be used in forming at least one nFET, at least one pFET or a combination of at least one nFET and at least one pFET on a surface of a semiconductor substrate. Typically, pFETs or a combination of pFETs and nFETs are formed.

In general terms, the method of the present invention comprises:

forming a first poly-Si containing material on a surface of a gate dielectric which is located on a semiconductor substrate, said first poly-Si containing material having a thickness of about 50 nm or less and having an interface with said gate dielectric;

introducing dopant atoms into said first poly-Si containing material by gas phase doping;

forming a doped second poly-Si containing material on said first poly-Si containing material, said doped second poly-Si containing material having a thickness that is greater than the first poly-Si containing material; and forming at least one field effect transistor (FET) on said semiconductor substrate, said at least one FET including a patterned stack comprising, from bottom to top, said gate dielectric, said first poly-Si containing material and said doped second poly-Si containing material.

In more specific terms, and when at least one nFET and at least one pFET are formed on a surface of a semiconductor substrate, the inventive method includes the steps of:

forming a first poly-Si containing material on a surface of a gate dielectric which is located on a semiconductor substrate having at least one nFET device region and at least one pFET device region, said first poly-Si containing material having a thickness of about 50 nm or less and having an interface with said gate dielectric;

selectively introducing dopant atoms into said first poly-Si containing material by gas phase doping, wherein n-type dopants are introduced into a region of said first poly-Si containing material atop said at least one nFET device region and p-type dopants are introduced into another region of said first poly-Si containing material atop said at least one pFET device region;

forming a second poly-Si containing material on said first poly-Si containing material, said second poly-Si containing material having a thickness that is greater than the first poly-Si containing material;

selectively doping said second poly-Si containing material such that p-type dopants are provided to a region of said second poly-Si containing material atop said at least one pFET device region and n-type dopants are provided to another region of said second poly Si-containing material atop said at least one nFET device region; and forming at least one nFET and at least one pFET on said semiconductor substrate, said at least one nFET including a patterned stack comprising, from bottom to top, said gate dielectric, said first poly-Si containing material that is doped n-type and said second poly-Si containing material that is doped n-type, and said at least one pFET including a patterned stack comprising, from bottom to top, said gate dielectric, said first poly-Si containing material that is doped p-type and said second poly-Si containing material that is doped p-type.

In addition to the methods described above, the present invention also provides semiconductor structures, particularly CMOS structures, that are fabricated utilizing the above-mentioned processing steps. In general terms, the CMOS structure of the present invention comprises:

at least one field effect transistor (FET) located on a semiconductor substrate, said at least one FET including a patterned stack comprising, from bottom to top, a gate dielectric, a doped first poly-Si containing material and a doped second poly-Si containing material, wherein said doped first poly-Si containing material has a thickness that is less than a thickness of said doped second poly-Si containing material, and wherein said doped first poly-Si containing material forms an interface with said gate dielectric in which the concentration of dopants at said interface is about $10^{19}$ atoms/cm$^3$ or greater.

In embodiments in which at least one pFET and at least one nFET are formed, the inventive CMOS structure includes:

at least one nFET located on a semiconductor substrate, said at least one nFET including a patterned stack comprising, from bottom to top, a gate dielectric, an n-doped first poly-Si containing material and an n-doped second poly-Si containing material; and at least one pFET located on said semiconductor substrate, said at least one pFET including a patterned stack comprising, from bottom to top, a gate dielectric, a p-doped first poly-Si containing material and a p-doped second poly-Si containing material, wherein each of said n– and p-doped first poly-Si containing materials has a thickness that is less than a thickness of said n– and p-doped second poly-Si containing materials, and wherein each of said n– and p-doped first poly-Si containing materials form an interface with said gate dielectric in which the concentration of dopants at said interface is about $10^{19}$ atoms/cm$^3$ or greater.

DETAILED DESCRIPTION OF THE INVENTION

The present invention, which provides a technique for controlling the poly-Si depletion effect in CMOS structures as well as the resultant CMOS structure that is formed by the same, will now be described in greater detail by referring to the following discussion and drawings that accompany the present application. It is noted that the drawings of the present application are provided for illustrative purposes and, as such, they are not necessarily drawn to scale.

In the description and drawings that follow, a preferred embodiment of the present invention is described and illustrated in which at least one nFET and at least one pFET are formed onto a surface of a semiconductor substrate. Although such description and illustration are made, the present invention is not limited to forming such a CMOS structure. Instead, the present invention can be used in forming a CMOS structure including at least one pFET or at least one nFET on a surface of the substrate.

Reference is made to FIGS. 1A-1H which illustrate the basic processing of the present invention used in forming a CMOS structure including at least one nFET and at least one pFET wherein gas phase doping is used to control the poly-Si depletion effect of each FET.

Figure 1A:
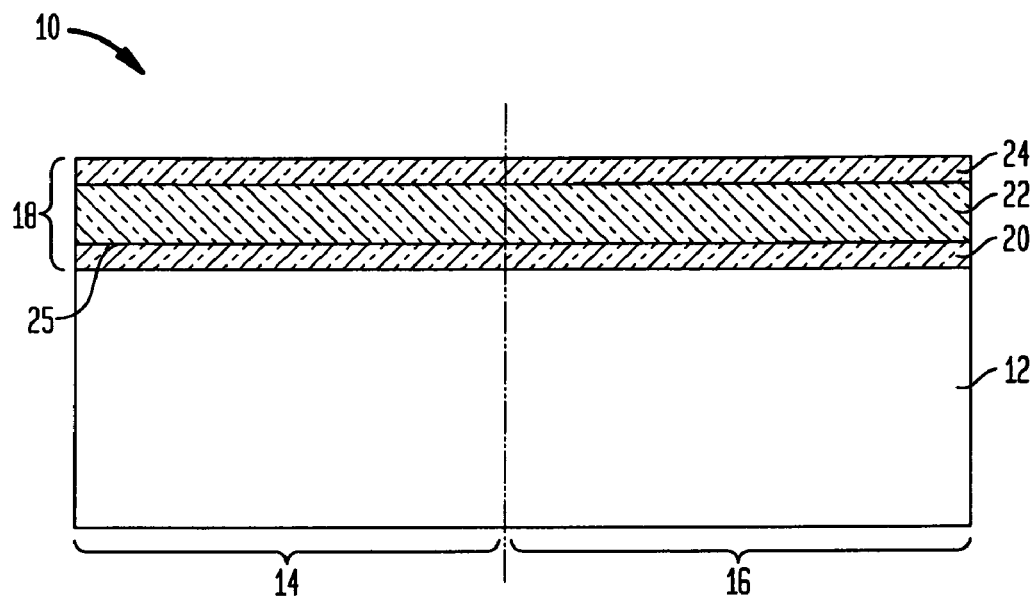
FIGS. 1A-1H are pictorial representations (through cross sectional views) depicting the basic processing steps used in forming a CMOS structure including at least one nFET and at least one pFET on a surface of a semiconductor substrate.

Reference is first made to FIG. 1A which illustrates an initial structure 10 that is employed in the present invention. As is illustrated, the initial structure 10 includes a semiconductor substrate 12 that includes at least one nFET device region 14 and at least one pFET device region 16. The initial structure 10 also includes a material stack 18 located atop the substrate 12 in both the nFET device region 14 and the pFET device region 16. The material stack 18 includes, from bottom to top, a gate dielectric 20, a first poly-Si containing material 22 and a hard mask 24.

The semiconductor substrate 12 of the initial structure 10 includes any semiconducting material including, for example, Si, SiGe, SiGeC, SiC, Ge alloys, GaAs, InAs, InP and other III/V or II/VI compound semiconductors. In addition to these listed types of semiconducting materials, the present invention also contemplates cases in which the semiconductor substrate 12 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

It is also noted that the semiconductor substrate 12 may be strained, unstrained or contain strained regions and unstrained regions therein. The semiconductor substrate 12 may also have a single crystal orientation or alternatively, the substrate 12 may be a hybrid semiconductor substrate that has surface regions having different crystallographic orientations. For example, the semiconductor substrate 12 within the nFET device region 14 may have a surface crystal orientation that is (100), while the semiconductor substrate within the pFET device region 16 may have a surface crystal orientation that is (110). The hybrid substrates may have bulk characteristics, SOI like characteristics or combinations of both bulk and SOI like characteristics.

The semiconductor substrate 12 may also have one or more isolation regions (not shown) such as, for example, trench isolation regions or field oxide isolation regions, located therein. The one or more isolation regions, which are typically present between the nFET device region and pFET device region, are formed utilizing conventional processing which is well known to those skilled in the art of semiconductor device manufacturing.

The gate dielectric 20 of the material stack 18 is formed on the surface of the semiconductor substrate 12 after the substrate has been processed. The gate dielectric 20 can be formed by a thermal growing process such as, for example, oxidation. Alternatively, the gate dielectric 20 can be formed by a deposition process such as, for example, chemical vapor deposition (CVD), plasma-assisted CVD, atomic layer or pulsed deposition (ALD or ALPD), evaporation, reactive sputtering, chemical solution deposition or other like deposition processes. The gate dielectric 20 may also be formed utilizing any combination of the above processes.

The gate dielectric 20 is comprised of an insulating material (or material stack) having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 20 employed in the present invention includes, but is not limited to: an oxide, nitride, oxynitride and/or silicates including metal silicates, aluminates, titanates and nitrides. In one embodiment, it is preferred that the gate dielectric 20 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof. Of these oxides, $SiO_2$ is typically used as the gate dielectric material.

The physical thickness of the gate dielectric 20 may vary, but typically, the gate dielectric 20 has a thickness from about 0.5 to about 10 nm, with a thickness from about 0.5 to about 5 nm being more typical.

After forming the gate dielectric 20, a first poly-Si containing material 22 is formed on the gate dielectric 20 utilizing a known deposition process such as, for example, physical vapor deposition (PVD), CVD or evaporation. As shown in FIG. 1A, the first poly-Si containing material 22 forms an interface 25 with the underlying gate dielectric 20.

The first poly-Si containing material 22 comprises polycrystalline Si, polycrystalline SiGe or multilayers thereof. Of these materials, it is preferred that the first poly-Si containing material to be comprised of polycrystalline Si. The first poly-Si containing material 22 is undoped at this point of the present invention. Typically, the first poly-Si containing material 22 used is a thin film having a vertical thickness that is about 50 nm or less, with a thickness from about 10 to about 30 nm being more typical.

The material stack 18 shown in FIG. 1A also includes a hard mask 24 which is formed atop the first poly-Si containing material 22. The hard mask 24 can be formed utilizing a thermal process such as, for example, oxidation, nitridation or oxynitridation. Alternatively, a deposition process such as, for example, CVD, PECVD, PVD, atomic layer deposition, evaporation or chemical solution deposition, can be used in forming the hard mask 24. Combinations of the aforementioned techniques are also contemplated for forming the hard mask 24. The hard mask 24 is comprised of an oxide, nitride, oxynitride, or any combination, including multilayers thereof. Typically, the hard mask 24 is comprised of an oxide, such as, for example, a low temperature oxide (LTO).

The thickness of the hard mask 24 may vary depending on, for example, the technique used in forming that material layer as well as the number of layers within the hard mask 24. Typically, the hard mask 24 of the material stack 18 has a thickness from about 10 to about 1000 nm, with a thickness from about 50 to about 100 nm being even more typical.

After forming the hard mask 24 of the material stack 18, a blanket layer of photoresist material (not shown) is then formed atop the hard mask 24. The photoresist material employed in the present invention includes a conventional positive-tone, negative-tone or hybrid photoresist. The photoresist material is formed by a conventional deposition process including, for example, spin-on coating, CVD, PECVD, or evaporation. After forming the blanket layer of photoresist material on the hard mask 24, the photoresist material is subjected to lithography which includes exposing the resist to a desired pattern of radiation and developing the exposed resist material utilizing a conventional resist developer. In the present application, the lithographic process provides a patterned photoresist material that is present atop the hard mask 24 in either the nFET device region 14 or the pFET device region 16. In the specific embodiment illustrated and described herein, the patterned photoresist material is present atop the hard mask 24 in the pFET device region 16, while the hard mask 24 in the nFET device region 14 is unprotected.

The unprotected hard mask 24 within the nFET device region 14 is then selectively removed utilizing an etching process that is capable of selectively removing the exposed hard mask 24, stopping on a surface of the underlying first poly-Si containing material 22. The resultant structure that is formed after the selective removal process has been performed is shown, for example, in FIG. 1B. The etching process performed in forming the structure shown in FIG. 1B includes dry etching such as, for example, reactive ion etching, ion beam etching or plasma etching, or a chemical wet etching process. When a chemical wet etching process is used in selectively removing the exposed hard mask 24 from the nFET device region 14, a chemical etchant such as, for example, HF, can be used to remove the exposed portion of the hard mask 24. As shown, the underlying poly-Si containing material 22 within the nFET device region 14 is exposed after the selective removal process has been performed. After etching, the patterned photoresist material is stripped from the structure utilizing a conventional resist stripping process.

At this point of the present invention n-type dopants including at least one atom from Group VA of the Periodic Table of Elements (CAS version) are introduced into the exposed poly-Si containing material 22 in the nFET device region 14 utilizing a gas phase doping process. The n-type dopants include for example P, As, Sb or mixtures thereof.

Figure 1B:
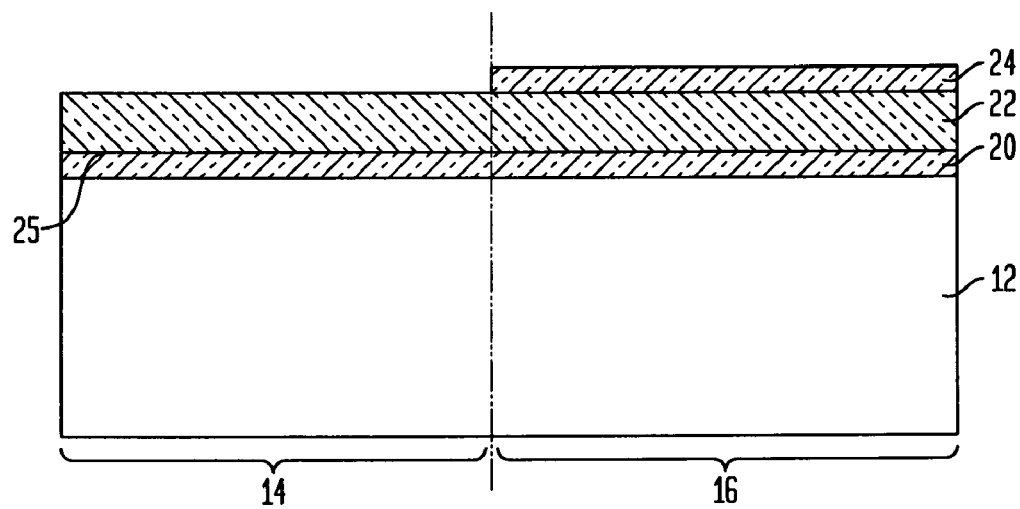

The gas phase doping process utilized to introduce the n-type dopants within the exposed first poly-Si containing material 22 comprises providing a gas (such as, for example $PH_3$ or $AsH_3$) including at least one of the above mentioned n-type dopants into a reactor including the structure shown in FIG. 1B and then annealing (i.e., heating) the structure. The annealing diffuses and activates the n-type dopant within the exposed first poly-Si containing material 22 such that a high concentration of said dopant is present at the interface 25. The term "high concentration" has the generally meaning provided above.

In accordance with the present invention, this anneal includes heating the structure to a temperature of about 500° C. or greater, with a temperature of about 800° C. or greater being more preferred. This anneal is carried out using a furnace anneal, a rapid thermal anneal, a spike anneal or a laser anneal. The exact duration of the anneal varies depending on the thickness of the first poly-Si containing material 22 as well as the type of annealing process employed. An inert gas such as He, Ar or He—Ar can be used during the gas phase doping process.

Figure 1C:
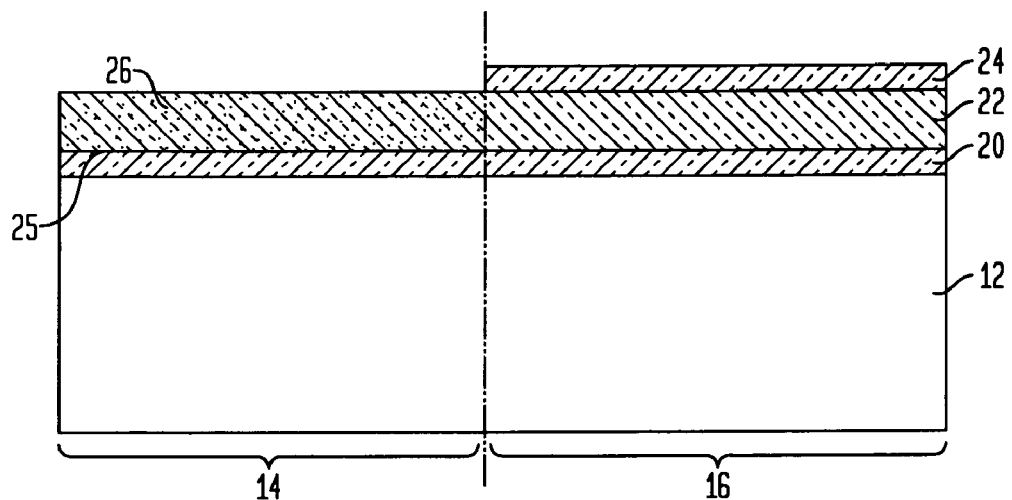

The structure that is formed after the gas phase doping of n-type dopants into the exposed portions of the first poly-Si containing material 22 is shown in FIG. 1C. In this drawing, reference numeral 26 denotes the n-doped first poly-Si containing material.

Figure 1D:
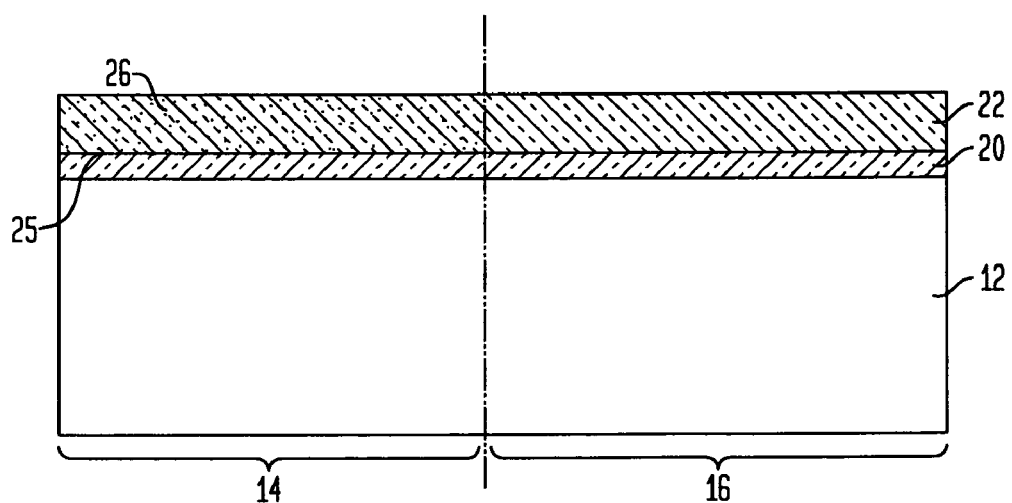

FIG. 1D shows the shows after removing the patterned hard mask 24 from atop the first poly-Si containing material 22 that is present in the pFET device region 16. The removal of the patterned hard mask 24 is performed utilizing a conventional stripping process, i.e., a chemical etching process, that selectively removes the remaining hard mask 24 from the structure.

Figure 1E:
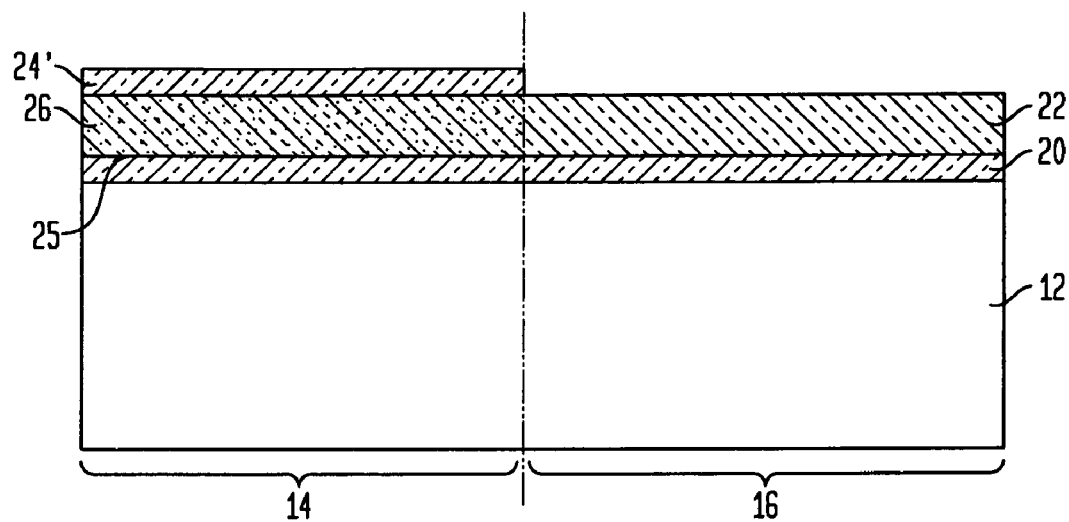

Next, and as shown in FIG. 1E, a second patterned hard mask 24' is formed atop the n-doped first poly-Si containing material 26 in the nFET device region 14. The second patterned hard mask 24' comprises one of the materials as mentioned above for the first hard mask 24 and it is fabricated utilizing the same technique (i.e., deposition, lithography and etching) as mentioned above. In the specific embodiment illustrated, the second patterned hard mask 24' protects the n-doped first poly-Si containing material 26 in the nFET device region 14, while leaving the first poly-Si containing material 22 in the pFET device region 16 exposed.

After forming the structure shown in FIG. 1E, a second gas phase doping process is performed. The second gas phase doping process introduces the opposite conductivity type dopant (as compared to the dopant used above) into the exposed poly-Si containing material 22. In the present case illustrated, p-type dopants are introduced into the exposed poly-Si containing material 22. The p-type dopants employed in the present invention include at least one atom from Group IIIA of the Periodic Table of Elements (CAS version) and they are introduced into the exposed poly-Si containing material 22 in the pFET device region 16 utilizing a gas phase doping process. The p-type dopants include for example B, Al, Ga or mixtures thereof.

The gas phase doping process utilized to introduce the p-type dopants within the exposed first poly-Si containing material 22 within the p-type device region 16 comprises providing a gas (such as, for example $BH_3$ or $AsH_3$) including at least one of the above mentioned p-type dopants into a reactor including the structure shown in FIG. 1E and then annealing (i.e., heating) the structure. The annealing diffuses and activates the p-type dopant within the exposed first poly-Si containing material 22 such that a high concentration of said dopant is present at the interface 25. The term "high concentration" has the generally meaning provided above.

In accordance with the present invention, this anneal includes heating the structure to a temperature of about 500° C. or greater, with a temperature of about 800° C. or greater being more preferred. This anneal is carried out using a furnace anneal, a rapid thermal anneal, a spike anneal or a laser anneal. The exact duration of the anneal varies depending on the thickness of the first poly-Si containing material as well as the type of annealing process employed. An inert gas such as He, Ar or He—Ar can be used during the gas phase doping process.

Figure 1F:
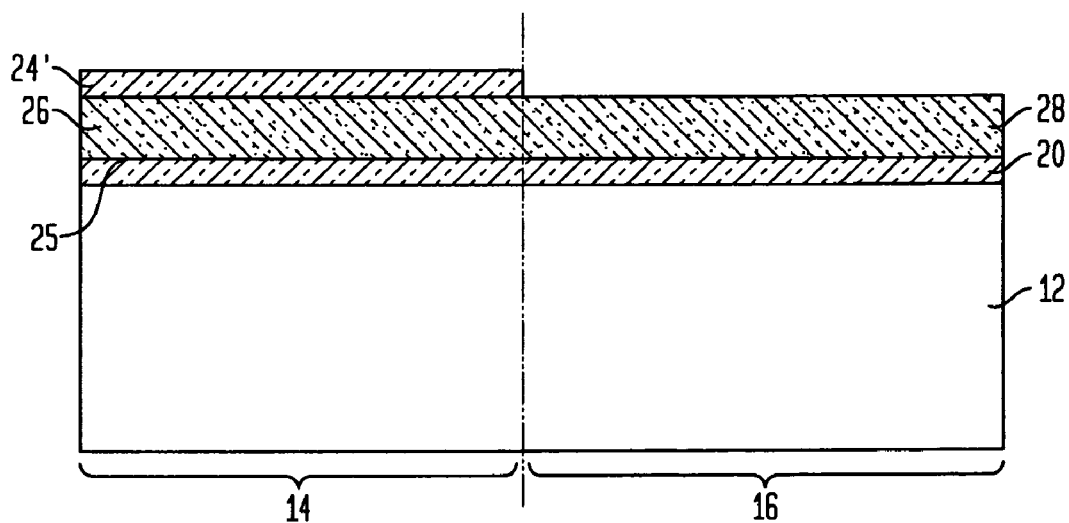

The structure that is formed after the gas phase doping of p-type dopants into the exposed portions of the first poly-Si containing material 22 is shown in FIG. 1F. In this drawing, reference numeral 28 denotes the p-doped first poly-Si containing material.

The second patterned hard mask 24' is then removed from atop the n-doped first poly-Si containing material 26 that is present in the nFET device region 14. The removal of the second patterned hard mask 24' is performed utilizing a conventional stripping process, i.e., a chemical etching process, that selectively removes the remaining hard mask 24' from the structure.

Figure 1G:
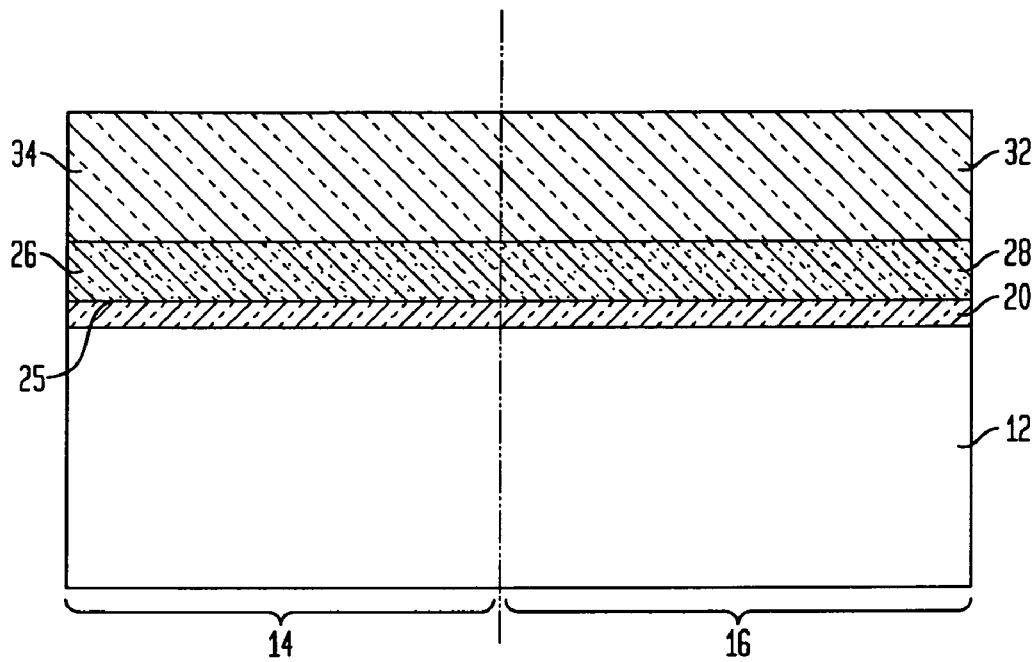

After removing the second patterned hard mask 24' from the structure, a second polySi containing film (not shown) is formed over the n-doped first polySi containing material 26 and the p-doped first poly-Si containing material 28; the second poly-Si film will eventually become layers 34 and 32 shown in FIG. 1G. In accordance with the present invention, the second poly-Si-containing material is a film having a thickness that is greater than the thickness of the first poly-Si containing material 22. Specifically, the second poly-Si containing material has a thickness of about 20 nm or greater, with a thickness from about 20 to about 100 nm being preferred. The second poly-Si containing material comprises the same or different material as the first poly-Si containing material 22 and it is formed utilizing one of the processes mentioned above.

At this point of the present invention, the second poly-Si containing film is selectively doped such that p-type dopants are provided to a region of said second poly-Si containing material atop said at least one pFET device region 16 and n-type dopants are provided to another region of said second poly Si-containing material atop said at least one nFET device region 14. The selective dopant process includes a series of masked ion implantation processes in which an ion implantation mask is formed over the material layers present in one of the device regions, while leaving the material stack in the other device region exposed. Appropriate dopant ions are then introduced into the exposed second poly-Si-containing material of the one of the device regions. Conventional ion implantation conditions are employed such that a majority of the implanted ions remain in the exposed second poly-Si containing material. The mask is then removed and another ion implantation masked is formed on the previously ion implanted material stack and the exposed material stack is then subjected to another ion implantation process. An activation annealing process (850° C. or greater) may follow each ion implantation step, or the activation anneal may be performed after both ion implantation steps.

It is noted that p-type dopants are selectively implanted into the second poly-Si containing material in the pFET device region 16 forming p-doped second poly-Si containing material 32, while n-type dopants are selectively implanted into the second poly-Si containing material in the nFET device region 14 forming n-doped second poly-Si containing material 34. The resultant structure that is formed after the selective ion implantation step has been performed is shown, for example, in FIG. 1G.

Figure 1H:
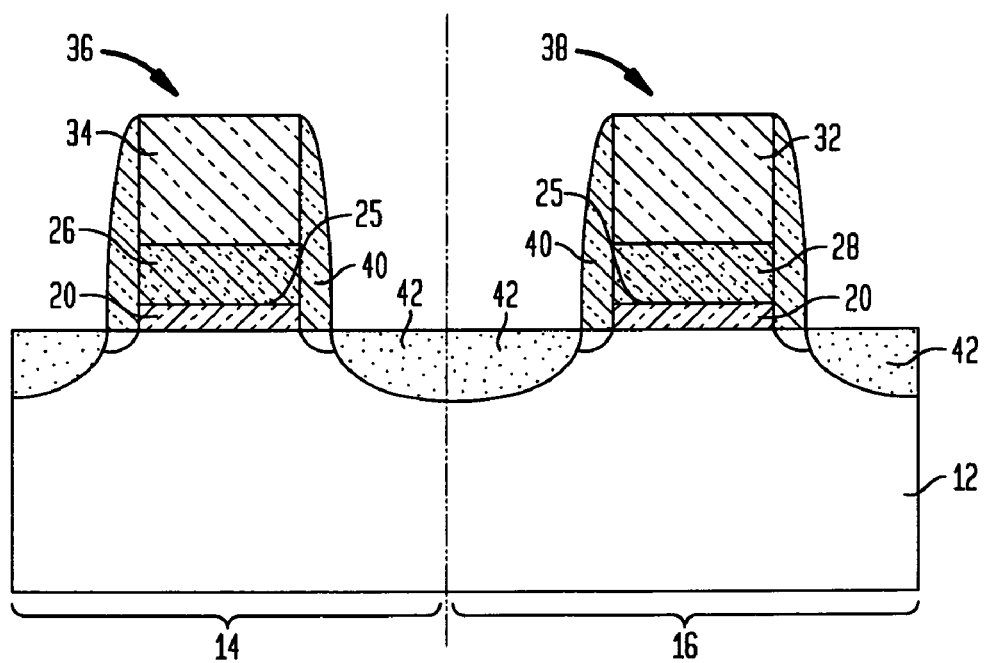

FIG. 1H shows the structure that is formed after further CMOS processing wherein at least one nFET 36 is formed within the nFET device region 14 and at least one pFET 38 is formed within the pFET device region 16. The at least one nFET 36 includes a patterned gate stack comprising, from bottom to top, the gate dielectric 20, the n-doped first poly-Si containing material 26, and the n-doped second poly-Si material 34. The at least one pFET 38 includes a patterned gate stack comprising, from bottom to top, the gate dielectric 20, the p-doped first poly-Si containing material 28, and the p-doped second poly-Si containing material 32. In accordance with the present invention, each of the FETs includes the interface 25 between the doped first poly-Si containing material and the gate dielectric in which the concentration of dopants at said interface is about $10^{19}$ atoms/cm$^3$ or greater. More preferably, the concentration of dopants at said interface is from about $10^{20}$ to about $5\times10^{21}$ atoms/cm$^3$.

In addition to providing a high concentration of dopant atoms at the gate dielectric/poly-Si gate interface, the inventive method as provides a means for obtaining uniformly distributed doping at the interface between the gate dielectric and the overlying poly-Si gate.

The patterned gate stacks shown in FIG. 1H are formed by lithography and etching. The lithographic process includes applying a photoresist material (not shown) to the n– and p-type doped second poly-Si containing materials, exposing the photoresist material to a pattern of radiation, and developing the exposed resist utilizing a conventional resist developer. Etching of the patterned stacks is typically performed utilizing a dry etching process such as reactive ion etching, ion beam etching, or plasma etching. Alternatively, a chemical wet etching process can be used to etch each of the gate stacks. In addition to these specified etching techniques, the present invention also contemplates utilizing any combination thereof.

In some embodiments of the present invention, a dielectric cap layer (not shown) such as an oxide, nitride, oxynitride or multilayer thereof, is formed atop the n– and p-doped second poly-Si containing materials prior to patterning.

Each FET may also include least one spacer 40 that is typically, but not always, formed on exposed sidewalls of each patterned gate stack. The at least one spacer 40 is comprised of an insulator such as an oxide, nitride, oxynitride and/or any combination thereof. The at least one spacer 40 is formed by deposition and etching. The width of the at least one spacer 40 must be sufficiently wide such that the source and drain silicide contacts (to be subsequently formed) do not encroach underneath the edges of the patterned gate stack. Typically, the source/drain silicide does not encroach underneath the edges of the patterned gate stack when the at least one spacer 40 has a width, as measured at the bottom, from about 20 to about 80 nm.

The patterned gate stacks can also be passivated at this point of the present invention by subjecting the same to a thermal oxidation, nitridation or oxynitridation process. The passivation step forms a thin layer of passivating material (not shown) about the material stack. This step may be used instead or in conjunction with the previous step of spacer formation. When used with the spacer formation step, spacer formation occurs after the material stack passivation process.

Source/drain diffusion regions 42 are then formed into the substrate 12 at this point of the present invention. The source/drain diffusion regions 42 are formed utilizing ion implantation and an annealing step. A raised source/drain process may be used. The annealing step serves to activate the dopants that were implanted by the previous implant step. The conditions for the ion implantation and annealing are well known to those skilled in the art. The source/drain diffusion regions 42 may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

Further CMOS processing such as formation of silicided contacts (source/drain and gate) as well as formation of BEOL (back-end-of-the-line) interconnect levels with metal interconnects can be formed utilizing processing steps that are well known to those skilled in the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a complementary metal oxide semiconductor (CMOS) structure comprising:

forming a first poly-Si containing material on a surface of a gate dielectric which is located on a semiconductor substrate having at least one nFET device region and at least one pFET device region, said first poly-Si containing material having a thickness of about 50 nm or less and having an interface with said gate dielectric;

selectively introducing dopant atoms into said first poly-Si containing material by gas phase doping and annealing at a temperature of about 500° C. or greater, wherein n-type dopants including at least one atom from Group VA of the Periodic Table of Elements are introduced into a region of said first poly-Si containing material atop said at least one nFET device region and p-type dopants including at least one atom from Group IIIA of the Periodic Table of Elements are introduced into another region of said first poly-Si containing material atop said at least one pFET device region, and wherein said interface between said first poly-Si material and said gate dielectric has a concentration of dopants of about $10^{19}$ atoms/cm$^3$ or greater which are uniformly distributed;

forming a second poly-Si containing material on said first poly-Si containing material, said second poly-Si containing material having a thickness that is greater than the first poly-Si containing material;

selectively doping by a masked ion implantation process said second poly-Si containing material such that p-type dopants including at least one atom from Group IIIA of the Periodic Table of Elements are provided to a region of said second poly-Si containing material atop said at least one pFET device region and n-type dopants including at least one atom from Group VA of the Periodic Table of Elements are provided to another region of said second poly Si-containing material atop said at least one nFET device region; and forming at least one nFET and at least one pFET on said semiconductor substrate, said at least one nFET including a patterned stack comprising, from bottom to top, said gate dielectric, said first poly-Si containing material that is doped n-type and said second poly-Si containing material that is doped n-type, and said at least one pFET including a patterned stack comprising, from bottom to top, said gate dielectric, said first poly-Si containing material that is doped p-type and said second poly-Si containing material that is doped p-type.

* * * * *